United States Patent
Lundin

(10) Patent No.: US 10,198,025 B2
(45) Date of Patent: Feb. 5, 2019

(54) APPARATUS AND METHOD FOR DETECTING A ROCKING MOVEMENT OF AN ELECTRONIC DEVICE AND EXECUTE A FUNCTION IN RESPONSE TO THE DETECTED MOVEMENT

(75) Inventor: Claes Lundin, Malmo (SE)

(73) Assignee: NOKIA TECHNOLOGIES OY, Espoo (FI)

( * ) Notice: Subject to any disclaimer, the term of this patent is extended or adjusted under 35 U.S.C. 154(b) by 493 days.

(21) Appl. No.: 13/807,729

(22) PCT Filed: Jul. 2, 2010

(86) PCT No.: PCT/IB2010/053057
§ 371 (c)(1),
(2), (4) Date: Mar. 28, 2013

(87) PCT Pub. No.: WO2012/001464
PCT Pub. Date: Jan. 5, 2012

(65) Prior Publication Data
US 2013/0177177 A1    Jul. 11, 2013

(51) Int. Cl.
| | | |
|---|---|---|
| *G05G 7/00* | (2006.01) | |
| *G06F 3/01* | (2006.01) | |
| *G06F 3/0338* | (2013.01) | |
| *H04M 1/725* | (2006.01) | |
| *H05K 5/02* | (2006.01) | |
| *H04M 1/02* | (2006.01) | |

(52) U.S. Cl.
CPC ............... *G05G 7/00* (2013.01); *G06F 3/01* (2013.01); *G06F 3/0338* (2013.01); *H04M 1/72519* (2013.01); *H05K 5/0217* (2013.01); *H04M 1/0202* (2013.01); *H04M 2250/12* (2013.01)

(58) Field of Classification Search
CPC .............. G06F 3/0346; H04M 2250/12; A63F 2300/105
See application file for complete search history.

(56) References Cited

U.S. PATENT DOCUMENTS

2007/0259685 A1* 11/2007 Engblom ............. G06F 1/1626
                                                              455/550.1
2008/0254837 A1   10/2008 Klinghult et al.
2008/0319252 A1   12/2008 Chapman et al.
(Continued)

FOREIGN PATENT DOCUMENTS

| CN | 101309731 A | 11/2008 |
| EP | 2 065 785 A1 | 6/2009 |

(Continued)

OTHER PUBLICATIONS

International Search Report for Application No. PCT/IB2010/053057 dated Mar. 9, 2011.
(Continued)

*Primary Examiner* — Duc Nguyen
*Assistant Examiner* — Kile O Blair
(74) *Attorney, Agent, or Firm* — Alston & Bird LLP

(57) ABSTRACT

An apparatus, method and computer program wherein the apparatus comprises: a housing comprising a convex portion configured to enable the apparatus to rock in response to an impulse provided by a user; and a processor configured to enable a function of the apparatus to be performed in response to the detection of the rocking of the apparatus.

21 Claims, 5 Drawing Sheets

(56) References Cited

U.S. PATENT DOCUMENTS

| | | | |
|---|---|---|---|
| 2009/0265671 A1 | 10/2009 | Sachs et al. | |
| 2010/0013651 A1* | 1/2010 | Spalink | G06F 3/0338 340/669 |
| 2010/0042954 A1* | 2/2010 | Rosenblatt | G06F 1/1626 715/863 |
| 2010/0142127 A1* | 6/2010 | Johansson | H04M 1/026 361/679.01 |
| 2010/0159995 A1* | 6/2010 | Stallings | G06F 3/0488 455/566 |

FOREIGN PATENT DOCUMENTS

| | | | |
|---|---|---|---|
| JP | 2006/130213 A | 5/2006 | |
| JP | 2008/210127 A | 9/2008 | |

OTHER PUBLICATIONS

He, Z. et al., *Gesture Recognition Based on 3D Accelerometer for Cell Phones Interaction*, IEEE (2008) pp. 217-220.

Joselli, M. et al., *gRmobile: A Framework for Touch and Accelerometer Gesture Recognition for Mobile Games*, IEEE (2009) pp. 141-150.

G-Lock, (updated May 27, 2010) [online] [retrieved Feb. 24, 2011]. Retrieved from the Internet: <URL: http://www.androidfreeware.net/download-g-lock.html>. 1 page.

Nokia 6600 Slide Mobile Phone | Mobile Phone Reviews UK (dated Mar. 26, 2009), ) [online] [retrieved Sep. 6, 2010]. Retrieved from the Internet: <URL: http://www.mobilephonereviews.org/nokia/nokia-6600-slide-mobile-phone/>. 4 pages.

Office Action for Chinese Application No. 201080067877.2 dated Jan. 26, 2015.

Written Opinion for Application No. PCT/IB2010/053057 dated Mar. 9, 2011.

Phat^ trance. "Symbian App: FlipSilent—Flip Over Your Phone to Make It Silent." [retrieved May 10, 2017]. Retrieved from the Internet: <URL: http://www.dailymobile.net/2009/05/23/symbian-app-flipsilent-flip-over-phone-to-make-it-silent/>. (dated May 23, 2009) 2 pages.

Extended European Search Report for European Patent Application No. 10854021.2 dated Apr. 24, 2017, 9 pages.

Rajawat, K et al.,—"Cross-Layer Design of Coded Multicast for Wireless Random Access Networks", IEEE Journal on Selected Areas in Communications vol. 29, No. 10, (dated Dec. 2011), pp. 1970-1980.

* cited by examiner

APPARATUS AND METHOD FOR DETECTING A ROCKING MOVEMENT OF AN ELECTRONIC DEVICE AND EXECUTE A FUNCTION IN RESPONSE TO THE DETECTED MOVEMENT

TECHNOLOGICAL FIELD

Embodiments of the present invention relate to an apparatus, method and computer program. In particular, they relate to an apparatus having a casing comprising a curved portion and a method and computer program for controlling such an apparatus.

BACKGROUND

Apparatus such as mobile telephones or gaming devices may have a large number of functions which are accessible to a user. It is useful to enable a user to easily access the functions of the apparatus.

BRIEF SUMMARY

According to various, but not necessarily all, embodiments of the invention there is provided an apparatus comprising: a housing comprising a convex portion configured to enable the apparatus to rock in response to an impulse provided by a user; and a processor configured to enable a function of the apparatus to be performed in response to detection of the rocking of the apparatus.

In some embodiments of the invention the apparatus may also comprise a detector configured to detect the rocking of the apparatus.

In some embodiments of the invention the rocking of the apparatus may comprise the apparatus rolling, at least one of, backwards and forwards while the convex portion supports the apparatus. At least one point of the convex portion may remain in contact with an external surface when the apparatus is rocking.

In some embodiments of the invention the convex portion may be configured to enable the apparatus to rest on a substantially horizontal surface in a stable equilibrium. The convex portion of the apparatus may be configured so that the apparatus returns to the stable equilibrium without any further input from the user after the impulse has been provided.

In some embodiments of the invention the housing may comprise a rear face and the convex portion may be provided on the rear face. The housing may comprise a front face and the front face may comprise a concave portion.

In some embodiments of the invention the processor may be configured to enable a function to be performed in response to the detection of simultaneous rocking of the apparatus and an input event. The input event may be associated with the provision of an audio output. The input event may comprise an incoming communication.

In some embodiments of the invention the apparatus may comprise a user input device such that when the user input device is configured in a locked mode the function may be performed while the user input device is in the locked mode.

In some embodiments of the invention the function may comprise disabling an audio output of the apparatus.

In some embodiments of the invention the function may comprise the display of information on a display.

In some embodiments of the invention the apparatus may be arranged in a plurality of operational modes and the function which is enabled may be dependent on the operational mode of the apparatus.

In some embodiments of the invention the detector may comprise an accelerometer.

In some embodiments of the invention the detector may comprise a tilt sensor.

According to various, but not necessarily all, embodiments of the invention there may also be provided a method comprising; detecting rocking of an apparatus wherein the apparatus comprises a housing comprising a convex portion configured to enable the apparatus to rock in response to an impulse provided by a user; and enabling a function of the apparatus to be performed in response to detection of the rocking of the apparatus.

In some embodiments of the invention the rocking of the apparatus may comprise the apparatus rolling at least one of backwards and forwards while the convex portion supports the apparatus. At least one point of the convex portion may remain in contact with an external surface when the apparatus is rocking.

In some embodiments of the invention the convex portion may be configured to enable the apparatus to rest on a substantially horizontal surface in a stable equilibrium. The convex portion of the apparatus may be configured so that the apparatus returns to the stable equilibrium without any further input from the user after the impulse has been provided.

In some embodiments of the invention the housing may comprise a rear face and the convex portion may be provided on the rear face. The housing may comprise a front face and the front face may comprise a concave portion.

In some embodiments of the invention the method may further comprise detecting an input event simultaneously to the rocking of the apparatus and enabling the function to be performed in response to detection of simultaneous rocking of the apparatus and the input event. The input event may be associated with the provision of an audio output. The input event may comprise an incoming communication.

In some embodiments of the invention the method may further comprise configuring a user input device in a locked mode and enabling the function to be performed while the user input device is in the locked mode.

In some embodiments of the invention the function may comprise disabling an audio output of the apparatus.

In some embodiments of the invention the function may comprise the display of information on a display.

In some embodiments of the invention the apparatus may be arranged in a plurality of operational modes and the function which is enabled may be dependent on the operational mode of the apparatus.

In some embodiments of the invention the rocking of the apparatus may be detected by an accelerometer.

In some embodiments of the invention the rocking of the apparatus may be detected by a tilt sensor.

According to various, but not necessarily all, embodiments of the invention there may also be provided a computer program comprising computer program instructions that, when executed by at least one processor, enable an apparatus at least to perform: detecting rocking of an apparatus wherein the apparatus comprises a housing comprising a convex portion configured to enable the apparatus to rock in response to an impulse provided by a user; and enabling a function of the apparatus to be performed in response to detection of the rocking of the apparatus.

In some embodiments of the invention there may also be provided a computer program comprising program instructions for causing a computer to perform a method as described in any of the preceding paragraphs.

In some embodiments of the invention there may also be provided a physical entity embodying a computer program as described in any of the preceding paragraphs.

In some embodiments of the invention there may also be provided an electromagnetic carrier signal carrying a computer program as described in any of the preceding paragraphs.

According to various, but not necessarily all, embodiments of the invention there may also be provided an apparatus comprising: means for enabling the apparatus to rock in response to an impulse provided by a user; and means for enabling a function of the apparatus to be performed in response to the detection of the rocking of the apparatus.

In some embodiments of the invention the apparatus may also comprise means for detecting the rocking of the apparatus.

In some embodiments of the invention the means for enabling the apparatus to rock may comprise a convex portion of a housing of the apparatus.

According to various, but not necessarily all, embodiments of the invention there may also be provided an apparatus comprising: a housing comprising a convex portion configured to enable the apparatus to rock in response to an impulse provided by a user at least one processor: and at least one memory including computer program code; wherein the at least one memory and the computer program code are configured to, with the at least one processor, enable the apparatus to: detect rocking of the apparatus; and enable a function of the apparatus to be performed in response to the detection of the rocking of the apparatus.

The apparatus may be for wireless communication.

BRIEF DESCRIPTION OF THE DRAWINGS

For a better understanding of various examples of embodiments of the present invention reference will now be made by way of example only to the accompanying drawings in which.

DETAILED DESCRIPTION

Figure 1:
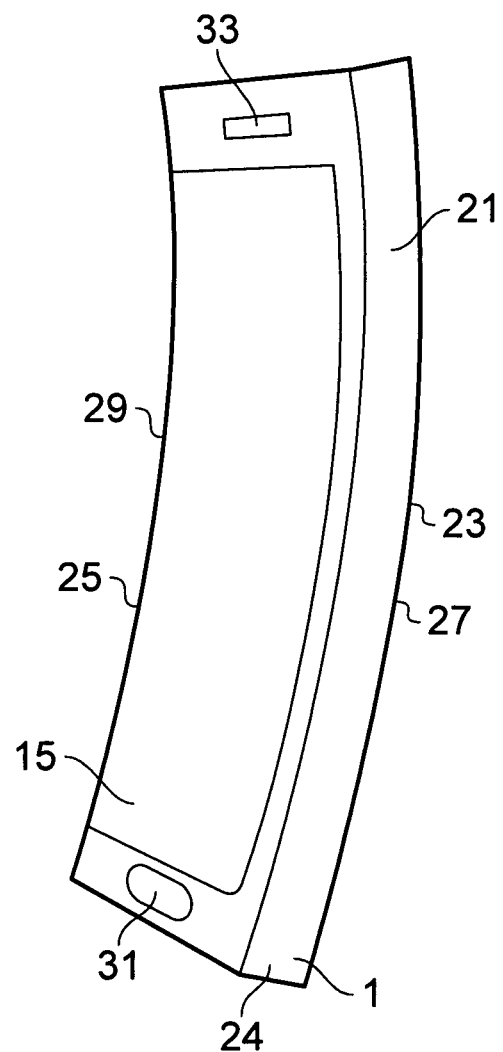
FIG. 1 illustrates an apparatus according to an exemplary embodiment of the invention.

The Figures illustrate an apparatus 1, method and computer program for controlling the apparatus 1 wherein the apparatus 1 comprises: a housing 21 comprising a convex portion 27 configured to enable the apparatus 1 to rock in response to an impulse provided by a user; and a processor 3 configured to enable a function of the apparatus 1 to be performed in response to detection of the rocking of the apparatus 1. The apparatus 1 may also comprise a detector 45 configured to detect rocking of the apparatus 1.

FIG. 1 illustrates an apparatus 1 according to an embodiment of the invention. The apparatus 1 may be an electronic apparatus. The apparatus 1 may be, for example, a mobile cellular telephone, a personal computer, a camera, a gaming device, a personal digital assistant, a personal music player, a navigation device such as a global positioning system (GPS) device or any other apparatus which enables a user to make user inputs to control the apparatus 1. The apparatus 1 may be a handheld apparatus 1 which can be carried in a user's hand, handbag or jacket pocket for example.

The apparatus 1 comprises a housing 21. The housing 21 provides an external casing for the apparatus 1. The components of the apparatus 1, which are illustrated schematically in FIG. 2, may be contained within the housing 21. The housing 21 may provide protection for the components of the apparatus 1. For example, the housing 21 may protect the components of the apparatus 1 from atmospheric conditions such as moisture or temperature variations. The housing 21 may also be configured to protect the components of the apparatus 1 from mechanical shocks. In some embodiments of the invention the housing 21 may be rigid.

The housing 21 comprises a front face 25 and a rear face 23. An edge portion 24 is provided between the front and rear faces. The front face 25 comprises a display 15 which enables information to be displayed. In some embodiments of the invention the display 15 may be a touch sensitive display which enables a user to make inputs by actuating the display 15. In the embodiment illustrated in FIG. 1 the apparatus 1 is a communication device and comprises a microphone 31 and a loudspeaker 33 positioned at opposite ends of the front face 25.

In the embodiment of the invention illustrated in FIG. 1 both the front face 25 and the rear face 23 comprise a curved portion. In this exemplary embodiment the rear face 23 comprises a convex portion 27 and the front face 25 comprises a concave portion 29. The curvature of the housing 21 may be arranged so as to improve the ergonomics of the apparatus 1, for example, the curvature of the housing 21 may be designed to make the apparatus 1 comfortable for a user to hold in their hands or, where the apparatus is a telephone, to enable the microphone 31 to be positioned closer to a user's mouth and the loudspeaker 33 to be positioned closer to a user's ear.

The radius of curvature of the curved portion 27 of the rear face 23 is such that when the rear face 23 of the apparatus 1 is resting on a substantially horizontal surface the curved portion 27 may support the apparatus 1. When the curved portion 27 is resting on a substantially horizontal surface the apparatus 1 may be in a stable equilibrium so that a small displacement from the resting position will cause the apparatus 1 to return to the resting position.

In the illustrated embodiment both the front face 25 and the rear face 23 comprise a curved portion. It is to be appreciated that in other embodiments of the invention only one of the faces may comprise a curved portion, for example the rear face 23 may be concave while the front face 25 may be substantially flat. Also in the illustrated embodiments the whole of the rear face 23 is curved. It is to be appreciated that in other embodiments of the invention only a portion of the rear surface 23 may be curved.

Figure 2:
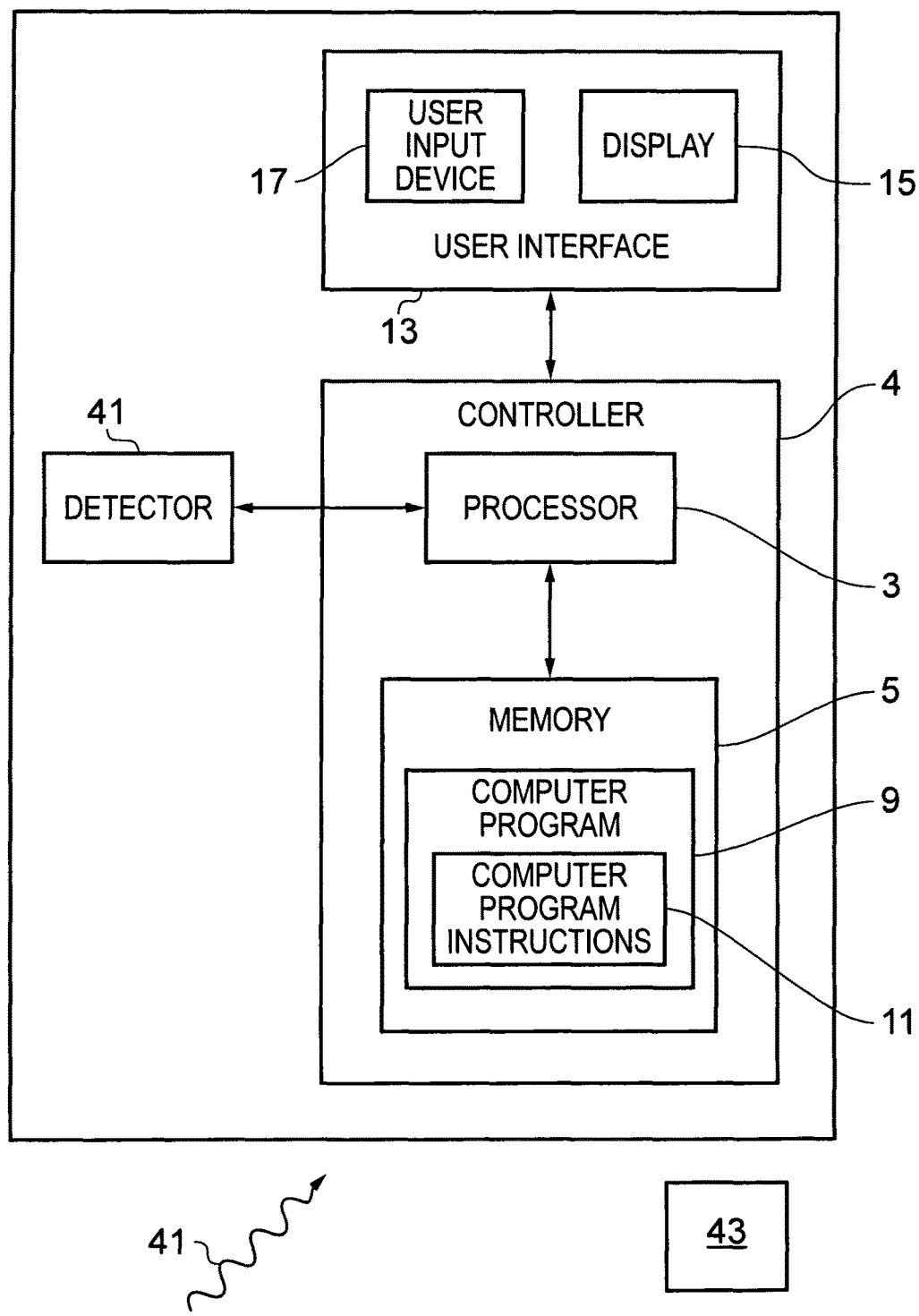
FIG. 2 schematically illustrates an apparatus according to an exemplary embodiment of the invention.

FIG. 2 schematically illustrates an apparatus 1 according to an exemplary embodiment of the invention.

Only features referred to in the following description are included in the schematic illustration of FIG. 2. It should be understood that the apparatus 1 may comprise additional features that are not illustrated. For example, in embodiments of the invention where the apparatus 1 is a mobile cellular telephone, the apparatus 1 may also comprise a transmitter and receiver configured to enable wireless communication. The apparatus 1 may also comprise additional user input means which enable a user to make different types of user inputs.

The apparatus 1 illustrated in FIG. 2 comprises: a user interface 13, a detector 45 and a controller 4. In the illustrated embodiment the controller 4 comprises at least one processor 3 and at least one memory 5 and the user interface 13 comprises a display 15 and a user input device 17.

The controller 4 provides means for controlling the apparatus 1. The controller 4 may be implemented using instructions that enable hardware functionality, for example, by using executable computer program instructions 11 in one or more general-purpose or special-purpose processors 3 that may be stored on a computer readable storage medium 43 (e.g. disk, memory etc) to be executed by such processors 3.

The controller 4 may be configured to control the apparatus 1 to perform a plurality of different functions. For example, where the apparatus 1 is a mobile cellular telephone the controller 4 may be configured to control the apparatus 1 to make and receive telephone calls and also to perform other functions such as send messages or access communication networks such as local area networks or the internet. In other embodiments the controller 4 may be configured to control the apparatus 1 to render content such as audio or visual files, thereby enabling a user to listen to music or watch videos using the apparatus 1. In other embodiments of the invention the apparatus 1 may be configured in a gaming mode to enable a user to play a game.

The controller 4 may also be configured to enable the apparatus 1 to detect rocking of the apparatus 1 where the apparatus 1 is rocking in response to an impulse provided by a user; and enable a function of the apparatus 1 to be performed in response to the detection of the rocking of the apparatus 1. The controller 4 may comprise a detector module for detecting the rocking of the apparatus 1.

The at least one processor 3 is configured to receive input commands from the user interface 13 and also to provide output commands to the user interface 13. The at least one processor 3 is also configured to write to and read from the at least one memory 5. Outputs of the user interface 13 are provided as inputs to the controller 4. The at least one processor 3 is also configured to receive input commands from the detector 45. The at least one processor 3 may also be configured to provide output commands to the detector 45.

In the embodiment illustrated in FIG. 2 the user interface 13 comprises a display 15 and a user input device 17.

The user input device 17 provides means for enabling a user of the apparatus 1 to input information which may be used to control the apparatus 1. The user input device 17 may also enable a user to input information which may be stored in the one or more memories 5 of the apparatus 1. The user input device 17 may comprise any means which enables a user to input information into the apparatus 1. For example the user input device 17 may comprise a keypad or a portion of a touch sensitive display or a combination of a number of different types of user input devices.

In some embodiments of the invention the user input device 17 may be configured in a locked mode or an unlocked mode. When the user input device 17 is in a locked mode the user input device 17 may be non-responsive to actuation except for a predetermined subset of inputs. The predetermined subset of inputs may comprise unlocking inputs. An unlocking input may require that specific sections of a user input device 17 are actuated in a specific sequence. The locked mode of the user input device 17 prevents accidental actuation of the user input device, for example when the apparatus 1 is being carried in a user's bag or pocket. When the user input device 17 is in the unlocked mode the user input device 17 may be responsive to actuation to access applications of the apparatus 1 and to control the apparatus 1.

The user interface 13 may also comprise a display 15. The display 15 may comprise any means which enables information or content to be displayed. The information which is displayed on the display 15 may comprise information which is stored in the one or more memories 5. The information may also comprise information which has been received by the apparatus 1 or which has been input using the user input device 17.

In some embodiments of the invention the display 15 and the user input device 17 may be integrated to form a touch sensitive display.

The apparatus 1 also comprises a detector 45. The detector 45 may comprise any means which enables motion of the apparatus 1 to be detected. The motion may be for example, a rocking motion of the apparatus 1. In some embodiments of the invention the detector may comprise an accelerometer, a tilt sensor, optical sensors or any other suitable means.

The detector 45 is configured to provide an output signal to the at least one processor 3. The output signal which is provided by the detector 45 may be dependent upon the movement which has been detected by the detector 45. The signal provided by the detector 45 may be used to control the apparatus 1.

The at least one memory 5 stores a computer program code 9 comprising computer program instructions 11 that control the operation of the apparatus 1 when loaded into the at least one processor 3. The computer program instructions 11 provide the logic and routines that enable the apparatus 1 to perform the methods illustrated in FIG. 3. The at least one processor 3 by reading the at least one memory 5 is able to load and execute the computer program 9.

The computer program instructions 11 may provide computer readable program means configured to control the apparatus 1. The program instructions 11 may provide, when loaded into the controller 4; means for detecting rocking of an apparatus 1 wherein the apparatus 1 comprises a housing comprising a convex portion 27 configured to enable the apparatus 1 to rock in response to an impulse provided by a user; and enabling a function of the apparatus 1 to be performed in response to the detection of the rocking of the apparatus 1.

The computer program code 9 may arrive at the apparatus 1 via any suitable delivery mechanism. The delivery mechanism may comprise, for example, a computer-readable storage medium, a computer program product 43, a memory device, a record medium such as a CD-ROM or DVD, an article of manufacture that tangibly embodies the computer program code 9. The delivery mechanism may comprise a signal 41 configured to reliably transfer the computer program code 9. The apparatus 1 may propagate or transmit the computer program code 9 as a computer data signal.

Although the memory 5 is illustrated as a single component it may be implemented as one or more separate components some or all of which may be integrated/removable and/or may provide permanent/semi-permanent/dynamic/cached storage.

References to 'computer-readable storage medium', 'computer program product', 'tangibly embodied computer program' etc. or a 'controller', 'computer', 'processor' etc. should be understood to encompass not only computers having different architectures such as single/multi-processor architectures and sequential (e.g. Von Neumann)/parallel architectures but also specialized circuits such as field-programmable gate arrays (FPGA), application integration specific circuits (ASIC), signal processing devices and other devices. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

Figure 3:
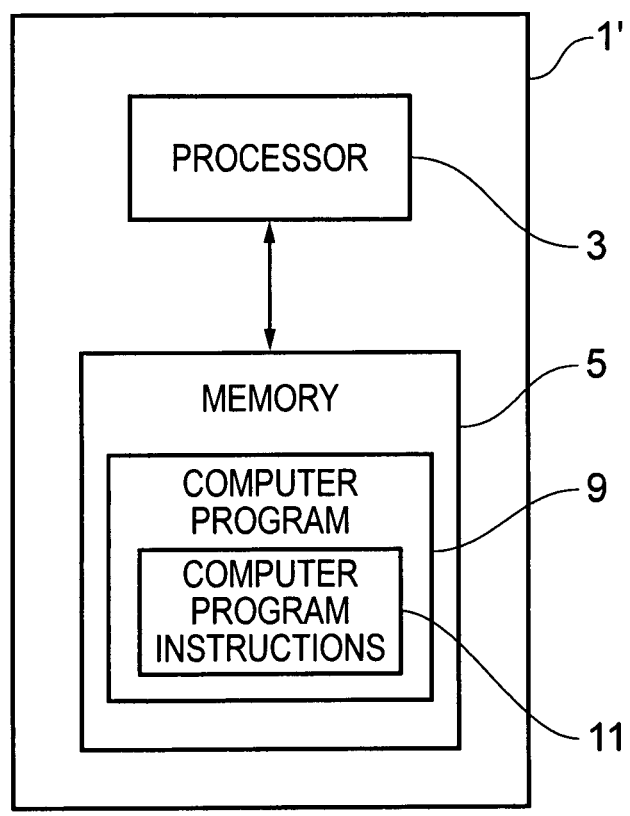
FIG. 3 schematically illustrates an apparatus according to another exemplary embodiment of the invention.

FIG. 3 illustrates an apparatus 1' according to another embodiment of the invention. The apparatus 1' illustrated in FIG. 3 may be a chip or a chip-set. The apparatus 1' comprises at least one processor 3 and at least one memory 5 as described above in relation to FIG. 1.

Figure 4:
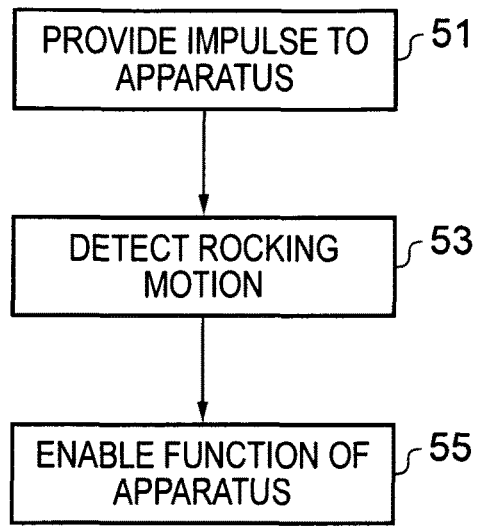
FIG. 4 is a flow diagram which schematically illustrates a method according to an exemplary embodiment of the invention
Figure 5:
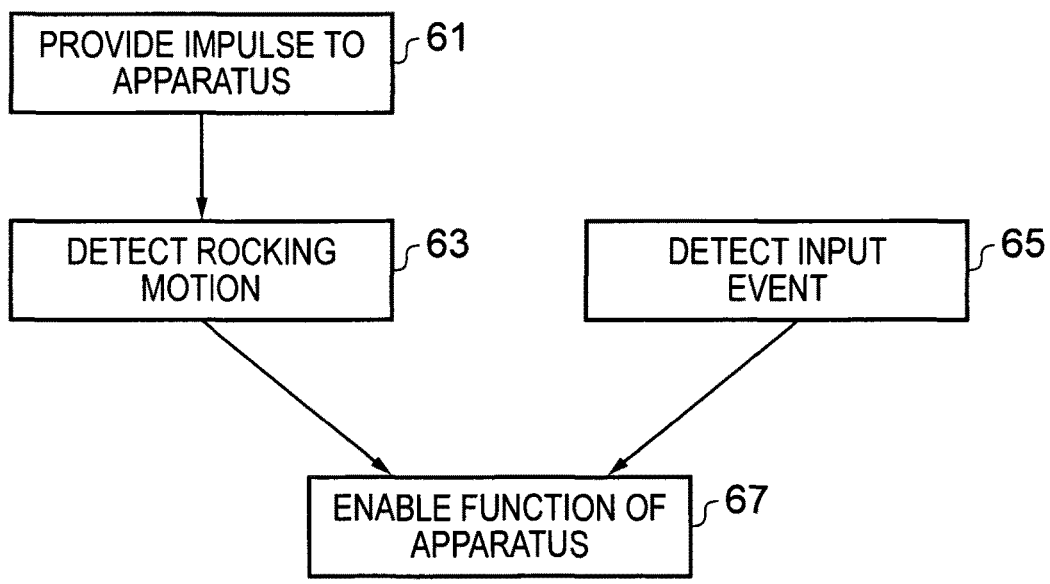
FIG. 5 is a flow diagram which schematically illustrates a method according to another exemplary embodiment of the invention.

Methods of controlling the apparatus 1, according to exemplary embodiments of the invention, are illustrated schematically in FIGS. 4 and 5.

FIG. 4 illustrates a method according to a first embodiment of the invention. At block 51 the user provides an impulse to the apparatus 1. The apparatus 1 may be resting on a substantially horizontal surface so that the convex portion 27 of the rear surface 23 is in contact with the horizontal surface and supporting the apparatus 1. The apparatus 1 may be resting in a stable equilibrium position. When the user provides the impulse to the apparatus 1 this causes the apparatus 1 to be displaced from the equilibrium position, however, provided that the displacement is small the apparatus 1 will return to the stable equilibrium position without any further input from the user.

The impulse may cause the apparatus 1 to rock on the substantially horizontal surface. When the apparatus 1 is rocking it may roll backwards and forwards on the substantially horizontal surface. When the apparatus 1 is rocking there may always be at least one point of the convex portion 27 of the housing 1 in contact with the substantially horizontal surface. The rocking motion may comprise simple harmonic motion.

At block 53 the detector 45 detects the rocking motion of the apparatus 1. The detector 45 provides a signal to the processor 3 indicating that a rocking motion has been detected.

In some embodiments of the invention the detector 45 may determine that the motion is a rocking motion and the signal which is provided to the processor 3 may indicate that the motion has been determined to be a rocking motion. In other embodiments of the invention the signal provided to the processor 3 may indicate that motion has been detected and the processor 3 may determine that it is a rocking motion which has been detected.

At block 55, in response to the receipt of the signal from the detector 45 the processor controls the apparatus 1 to enable a function of the apparatus 1. The function which is enabled may depend upon the mode of operation of the apparatus 1. For example, where the apparatus 1 has a plurality of different applications the function which is performed may depend upon the application which is currently accessed when the rocking motion is detected.

The function may be, for example, silencing an audio alert of the apparatus. The silencing of the audio alert may be temporary, for example it may silence only a currently playing audio alert. In other embodiments of the invention the function may comprise enabling information to be displayed on the display 15. The information displayed on the display 15 may include information relating to the status of the apparatus 1, for example whether or not a communication has been received or may include information such as the time. The information may be displayed on the display 15 for a short period of time.

In embodiments of the invention where the apparatus 1 is used to render content the function may enable the user to control the content being rendered. For example it may enable a user to change the content which is being rendered, by switching music tracks or selecting a different piece of content.

In embodiments of the invention where the apparatus 1 enables a game to be played the function which is enabled may be controlling a participant or object in a game.

In some embodiments of the invention where the user input device 17 may have been configured in a locked mode before the user provides the impulse to the apparatus 1. In such embodiments the function may be performed while the user input device 17 remains in the locked mode so that the user input device 17 remains non-responsive to actuation.

FIG. 5 illustrates a method according to a second embodiment of the invention. At block 61 the user provides an impulse to the apparatus 1. Block 61 of the method of FIG. 5 corresponds to block 51 of the method of FIG. 4. At block 63 the detector 45 detects the rocking motion of the apparatus 1 and provides a signal to the processor 3. Block 63 of the method of FIG. 5 corresponds to block 53 of the method of FIG. 4.

At block 65 an input event is detected. The detection of the input event may occur simultaneously to the detection of the rocking of the apparatus 1. In other embodiments of the invention the input event may be detected before the rocking motion. The input event may occur immediately between the rocking motion so that only a very short period of time elapses before the input event and the rocking motion. The input event may comprise any event which may be detected by the detector 45 or other part of the apparatus and which occurs in addition to the rocking motion may be an incoming communication, for example, it may be an incoming call or message. The input event may be associated with providing an audio output to a user, for example, an audio alert may be provided when an incoming call or message is received or a user may set an alarm or reminder with an associated audio output.

At block 67, in response to the receipt of the signal from the detector 45 and the detection of the input event the at least one processor 3 controls the apparatus 1 to enable a function of the apparatus 1. The function which is enabled may depend upon the mode of operation of the apparatus 1 and the input event. For example, where the input event is an incoming call or message the function of the apparatus which is performed may be the silencing of the audio alert which is associated with the incoming call or message. The silencing may silence the apparatus, just for the detected incoming communication or it may configure the apparatus 1 in a silent mode which disables all audio outputs until the silent mode is deactivated.

Figure 6A:
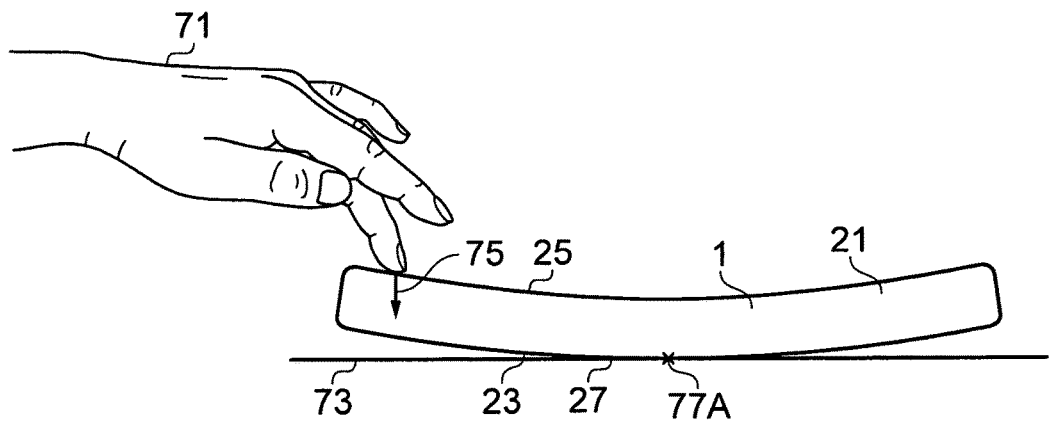
FIGS. 6A to 6D illustrate an exemplary embodiment of the invention in use.

FIGS. 6A to 6D illustrate an exemplary embodiment of the invention in use. In FIG. 6A the apparatus 1 is resting on a substantially horizontal surface 73 so that the convex portion 27 of the rear surface 23 is resting on the substantially horizontal surface 73. The convex portion 27 is supporting the apparatus 1. A contact point 77A of the convex portion 27 touches the horizontal surface 73. In the rest position the apparatus 1 is in a stable equilibrium so that a minor displacement of the apparatus 1 from this position will cause the apparatus 1 to return to the same rest position. In the rest position the centre of mass of the apparatus 1 may be positioned over the contact point 77A of the apparatus 1.

In the exemplary embodiment the contact point 77A is provided in the centre of the apparatus 1.

In FIG. 6A the user provides an impulse to the apparatus 1 by using their hand 71 to push downwards on one end of the apparatus 1 in the direction of the arrow 75. The impulse provides a torque which causes the apparatus 1 to rock on the substantially horizontal surface 73.

The apparatus 1 rocks by rolling backwards and forwards on the convex portion 27. At least one point of the convex portion 27 may always be in contact with the horizontal surface 73. The rocking motion may not include any translation motion.

Figure 6B:
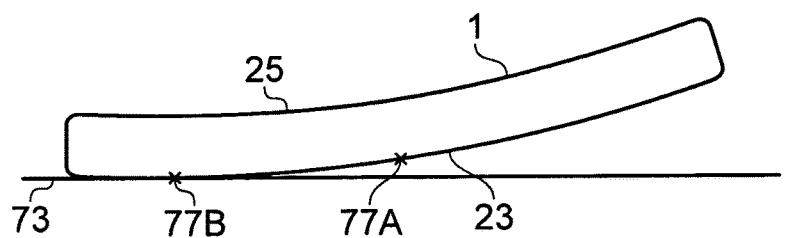

FIG. 6B illustrates the apparatus just after the user has provided the impulse. The impulse has forced one end of the apparatus 1 down so that a second point 77B of the curved portion 27 now contacts the substantially horizontal surface 73. The second point 77B is provided towards a first end of the apparatus 1. The first contact point 77A is no longer in contact with the substantially horizontal surface 73. As the centre of mass of the apparatus 1 is no longer directly above a point which is in contact with the substantially horizontal surface 73 a resultant torque will act on the apparatus 1. The resultant torque and the shape of the curved portion 27 cause the apparatus 1 to rock.

Figure 6C:
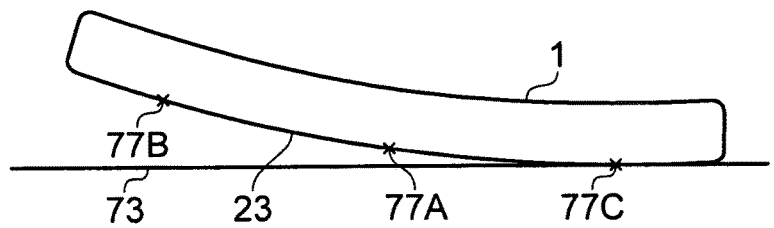

In FIG. 6C the apparatus has rocked so that a third point 77C of the curved portion 27 now contacts the substantially horizontal surface 73. The third point 77C is provided towards a second end of the apparatus 1. The second end of the apparatus 1 is opposite the first end of the apparatus 1. Neither the first point 77A nor the second point 77B of the curved portion 27 are in contact with the substantially horizontal surface 73.

Figure 6D:
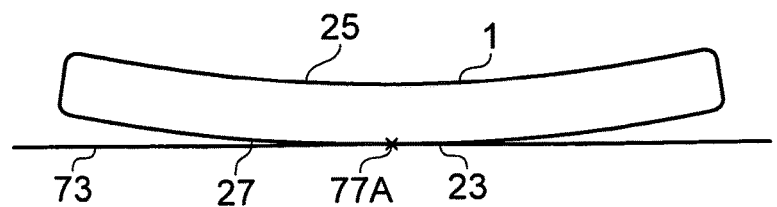

The apparatus will continue to rock backwards and forwards until the energy provided by the impulse has been dissipated. The apparatus 1 will return to the rest position as illustrated in FIG. 6D where the first point 77A of the contact portion is in contact with the substantially horizontal surface 73. The convex portion is shaped so that the apparatus 1 will return to this position without any further input being required by the user.

Embodiments of the invention as described above provide the advantage that they enable a user to quickly and easily access functions of the apparatus 1.

As the detector 45 detects the rocking motion of the apparatus 1 only a single input is required by the user. Furthermore the input may be any input which provides an impulse and causes the rocking motion. The input may be made at a number of different positions of the apparatus. This makes the input very quick and easy to make. It may also enable the input to be made without the using having to even look at the apparatus 1.

Also the rocking motion which is detected may be a very specific motion this may prevent the function being enabled inadvertently. For example it reduces the likelihood of incidental motion of the apparatus 1 as it is being carried in a bag or pocket being detected and used as an input to enable the function.

Embodiments of the invention may also enable the function to be enabled without unlocking a user input device 17. This may make it quicker and easier for a user to access functions of the apparatus 1. It may also make the apparatus 1 more efficient as the user input device 17 need not be activated every time that a user wishes to access functions of the apparatus 1.

The blocks illustrated in FIGS. 4 and 5 may represent steps in a method and/or sections of code in the computer program 9. The illustration of a particular order to the blocks does not necessarily imply that there is a required or preferred order for the blocks and the order and arrangement of the block may be varied. Furthermore, it may be possible for some blocks to be omitted.

Although embodiments of the present invention have been described in the preceding paragraphs with reference to various examples, it should be appreciated that modifications to the examples given can be made without departing from the scope of the invention as claimed. For example, in some embodiments of the invention the apparatus may be configured to detect part of the rocking motion and determine this to be rocking motion, that is, the rocking motion may comprise a backwards motion and a forwards motion but the function may be performed in response to detection of just the backwards motion or just the forwards motion.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

I claim:

1. An apparatus comprising:
    a housing comprising a convex portion configured to enable the apparatus to rock in response to an impulse provided by a user; and
    a processor configured to enable a function of the apparatus to be performed in response to detection of the rocking of the apparatus wherein the apparatus may be arranged in a plurality of operational modes, wherein the apparatus has an unlocked mode in which a user input device is responsive to user actuation, and a locked mode in which the user input device is non-responsive to user actuation, wherein the processor is configured such that the function which is enabled is performed in response to rocking of the apparatus being detected, wherein the apparatus is in the locked mode before the impulse is provided by the user and the function is performed while the apparatus remains in the locked mode so that the user input device remains non-responsive to user actuation other than for a predetermined subset of inputs configured to control an operation being enabled on the apparatus with respect to the function.

2. An apparatus as claimed in claim 1 comprising a detector configured to detect the rocking of the apparatus.

3. An apparatus as claimed in claim 1 wherein the rocking of the apparatus comprises the apparatus rolling at least one of backwards and forwards while the convex portion supports the apparatus.

4. An apparatus as claimed in claim 3 wherein at least one point of the convex portion remains in contact with an external surface when the apparatus is rocking.

5. An apparatus as claimed in claim 1 wherein the convex portion is configured to enable the apparatus to rest on a substantially horizontal surface in a stable equilibrium.

6. An apparatus as claimed in claim 5 wherein the convex portion of the apparatus is configured so that the apparatus returns to the stable equilibrium without any further input from the user after the impulse has been provided.

7. An apparatus as claimed in claim 1 wherein the housing comprises a rear face and the convex portion is provided on the rear face.

8. An apparatus as claimed in claim 1 wherein the processor is configured to enable a function to be performed in response to the detection of simultaneous rocking of the apparatus and an input event.

9. An apparatus as claimed in 8 wherein the input event is associated with the provision of an audio output or silencing an audio output.

10. An apparatus as claimed in claim 8 wherein the input event comprises an incoming communication.

11. An apparatus as claimed in claim 1 wherein the function comprise at least one of disabling an audio output of the apparatus, the display of information on a display.

12. An apparatus as claimed in claim 1, wherein the detector comprises at least one of an accelerometer, a tilt sensor.

13. An apparatus as claimed in claim 1 wherein the user input device comprises a display.

14. The apparatus as claimed in claim 1, wherein controlling the operation comprises switching or selecting one or more media items.

15. A method comprising;
    detecting rocking of an apparatus wherein the apparatus comprises a housing comprising a convex portion configured to enable the apparatus to rock in response to an impulse provided by a user;
    enabling a function of the apparatus to be performed in response to detection of the rocking of the apparatus wherein the apparatus may be arranged in a plurality of operational modes, wherein the apparatus has an unlocked mode in which a user input device is responsive to user actuation, and a locked mode in which the user input device is non-responsive to user actuation; and
    controlling the user input device such that the function which is enabled is performed in response to rocking of the apparatus being detected, wherein the apparatus is in the locked mode before the impulse is provided by the user and the function is performed while the apparatus remains in the locked mode so that the user input device remains non-responsive to user actuation other than for a predetermined subset of inputs configured to control an operation being enabled on the apparatus with respect to the function.

16. A method as claimed in claim 15 wherein the rocking of the apparatus comprises the apparatus rolling at least one of backwards and forwards while the convex portion supports the apparatus.

17. A method as claimed in claim 16 wherein at least one point of the convex portion remains in contact with an external surface when the apparatus is rocking.

18. A method as claimed in claim 15 wherein the convex portion is configured to enable the apparatus to rest on a substantially horizontal surface in a stable equilibrium.

19. A method as claimed in claim 18 wherein the convex portion of the apparatus is configured so that the apparatus returns to the stable equilibrium without any further input from the user after the impulse has been provided.

20. A computer program product comprising a non-transitory computer-readable storage medium comprising computer program instructions that, when executed by at least one processor, enable an apparatus at least to perform:
    detecting rocking of an apparatus wherein the apparatus comprises a housing comprising a convex portion configured to enable the apparatus to rock in response to an impulse provided by a user;
    enabling a function of the apparatus to be performed in response to detection of the rocking of the apparatus wherein the apparatus may be arranged in a plurality of operational modes, wherein the apparatus has an unlocked mode in which a user input device is responsive to user actuation, and a locked mode in which the user input device is non-responsive to user actuation; and
    controlling the user input device such that the function which is enabled is performed in response to rocking of the apparatus being detected, wherein the apparatus is in the locked mode before the impulse is provided by the user and the function is performed while the apparatus remains in the locked mode so that the user input device remains non-responsive to user actuation other than for a predetermined subset of inputs configured to control an operation being enabled on the apparatus with respect to the function.

21. An apparatus comprising a processor and a memory including computer program code, the memory and the computer program code configured to, with the processor, cause the apparatus to:
    detect rocking of a device, wherein the device comprises a housing comprising a convex portion configured to enable the device to rock in response to an impulse provided by a user and a concave display on a concave front face;
    enable a function to be performed in response to detection of the rocking of the device, wherein the apparatus is arranged in any one of a plurality of operational modes, wherein the apparatus has an unlocked mode in which a user input device is responsive to user actuation, and a locked mode in which the user input device is non-responsive to user actuation; and
    control the user input device such that the function which is enabled is performed in response to rocking of the device being detected, wherein the apparatus is in the locked mode before the impulse is provided by the user and the function is performed while the apparatus remains in the locked mode so that the user input device remains non-responsive to user actuation other than for a predetermined subset of inputs configured to control an operation being enabled on the apparatus with respect to the function.

\* \* \* \* \*